(12) United States Patent
Xiao et al.

(10) Patent No.: US 8,471,323 B2
(45) Date of Patent: Jun. 25, 2013

(54) 3-D ELECTRICALLY PROGRAMMABLE AND ERASABLE SINGLE-TRANSISTOR NON-VOLATILE SEMICONDUCTOR MEMORY DEVICE

(75) Inventors: De Yuan Xiao, Shanghai (CN); Gary Chen, Shanghai (CN); Roger Lee, Shanghai (CN)

(73) Assignees: Semiconductor Manufacturing International (Shanghai) Corporation, Pudong New Area, Shanghai (CN); Semiconductor Manufacturing International (Beijing) Corporation, Economic-Technological Development Area Daxing District, Beijing (CN)

( * ) Notice: Subject to any disclaimer, the term of this patent is extended or adjusted under 35 U.S.C. 154(b) by 145 days.

(21) Appl. No.: 12/880,039

(22) Filed: Sep. 10, 2010
(Under 37 CFR 1.47)

(65) Prior Publication Data
US 2011/0084327 A1    Apr. 14, 2011

(30) Foreign Application Priority Data

Sep. 18, 2009   (CN) .......................... 2009 1 0195983

(51) Int. Cl.
*H01L 29/788* (2006.01)
(52) U.S. Cl.
USPC .............. 257/315; 257/E21.209; 257/E21.21; 257/E29.3
(58) Field of Classification Search
USPC .............. 257/314, 315, 316, E29.3, E21.209, 257/E21.21
See application file for complete search history.

(56) References Cited

U.S. PATENT DOCUMENTS

| 4,698,787 | A | 10/1987 | Mukherjee et al. | |
|---|---|---|---|---|
| 5,029,130 | A | 7/1991 | Yeh | |
| 2003/0197219 | A1* | 10/2003 | Kim et al. | 257/316 |
| 2005/0230741 | A1* | 10/2005 | Tsunoda et al. | 257/315 |
| 2006/0202258 | A1* | 9/2006 | Mokhlesi et al. | 257/315 |
| 2006/0249781 | A1* | 11/2006 | Mori | 257/321 |
| 2007/0238053 | A1* | 10/2007 | Hashimoto | 430/313 |
| 2008/0017911 | A1* | 1/2008 | Akahori et al. | 257/314 |
| 2011/0220983 | A1* | 9/2011 | Osame et al. | 257/316 |

* cited by examiner

*Primary Examiner* — Jerome Jackson, Jr.
*Assistant Examiner* — Paul Budd
(74) *Attorney, Agent, or Firm* — Kilpatrick Townsend & Stockton LLP

(57) ABSTRACT

A non-volatile memory device includes a source region, a drain region, and a channel region therebetween. The channel region has a length extending from the source region to the drain region and a channel width in the direction perpendicular to the channel length direction. The device includes a floating gate positioned between the source and the drain in the channel length direction. The width of the floating gate is less than the channel width. A control gate covers a top surface and a side surface of the floating gate. The control gate also overlies an entirety of the channel region. Erasure of the cell is accomplished by Fowler-Nordheim tunneling from the floating gate to the control gate. Programming is accomplished by electrons migrating through an electron concentration gradient from a channel region underneath the control gate into a channel region underneath the floating gate and then injecting into the floating gate.

14 Claims, 13 Drawing Sheets

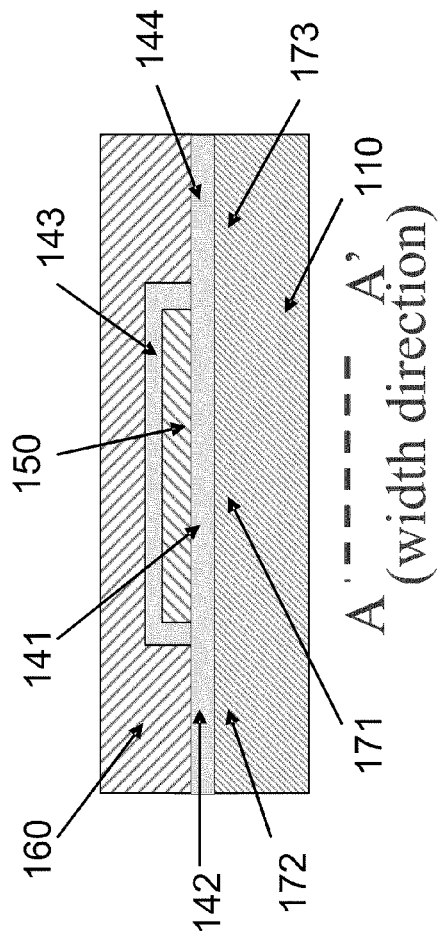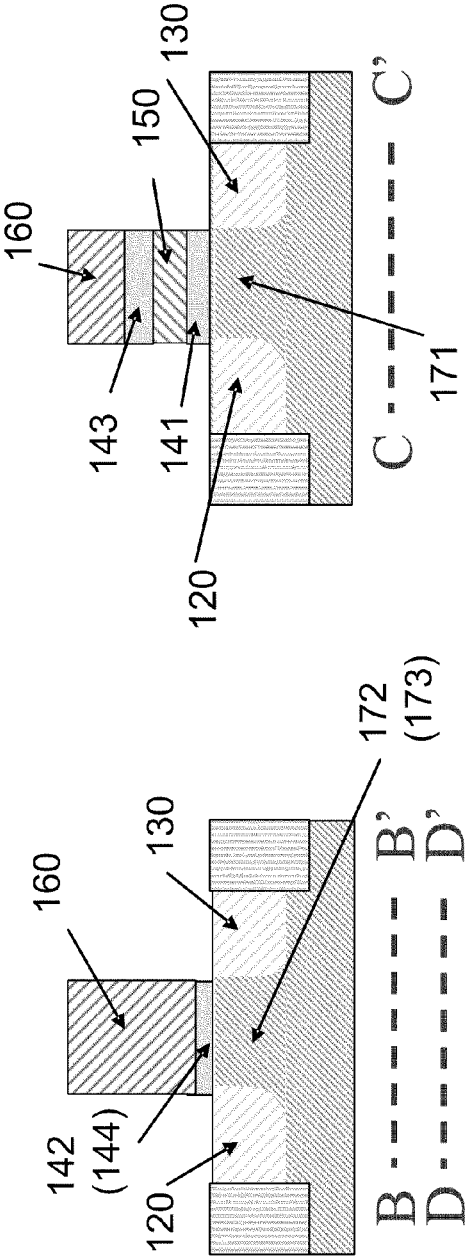
FIG. 1b
FIG. 1c
FIG. 1d

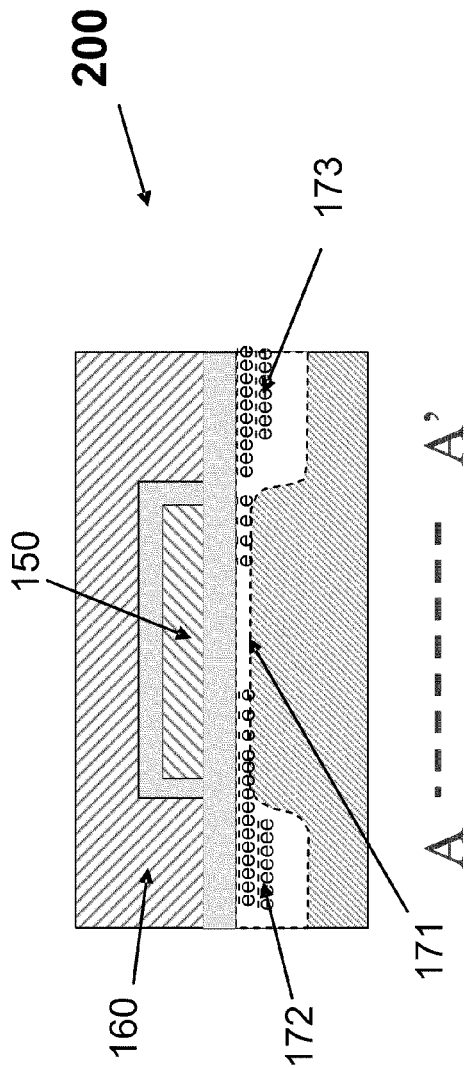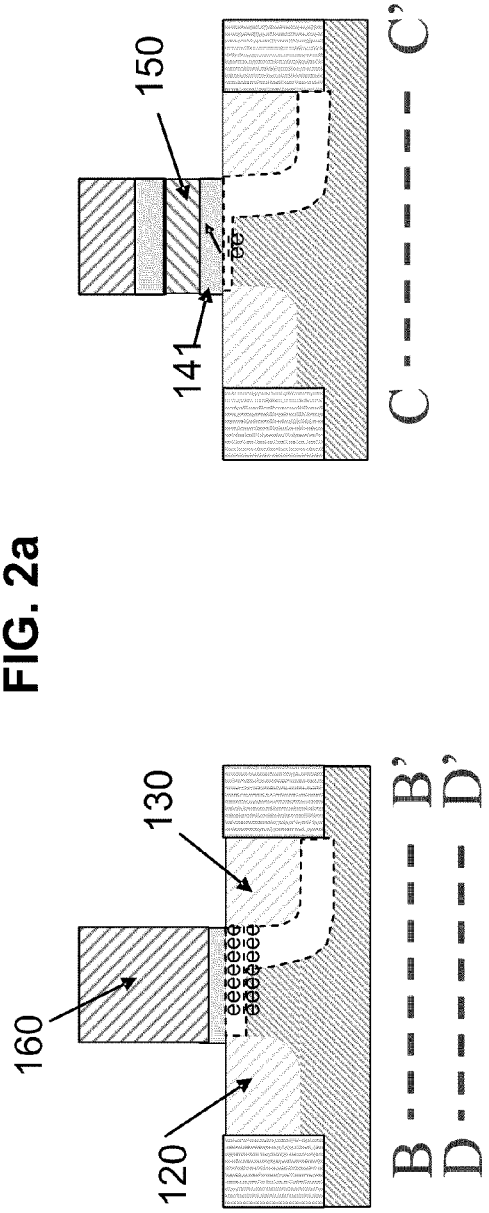

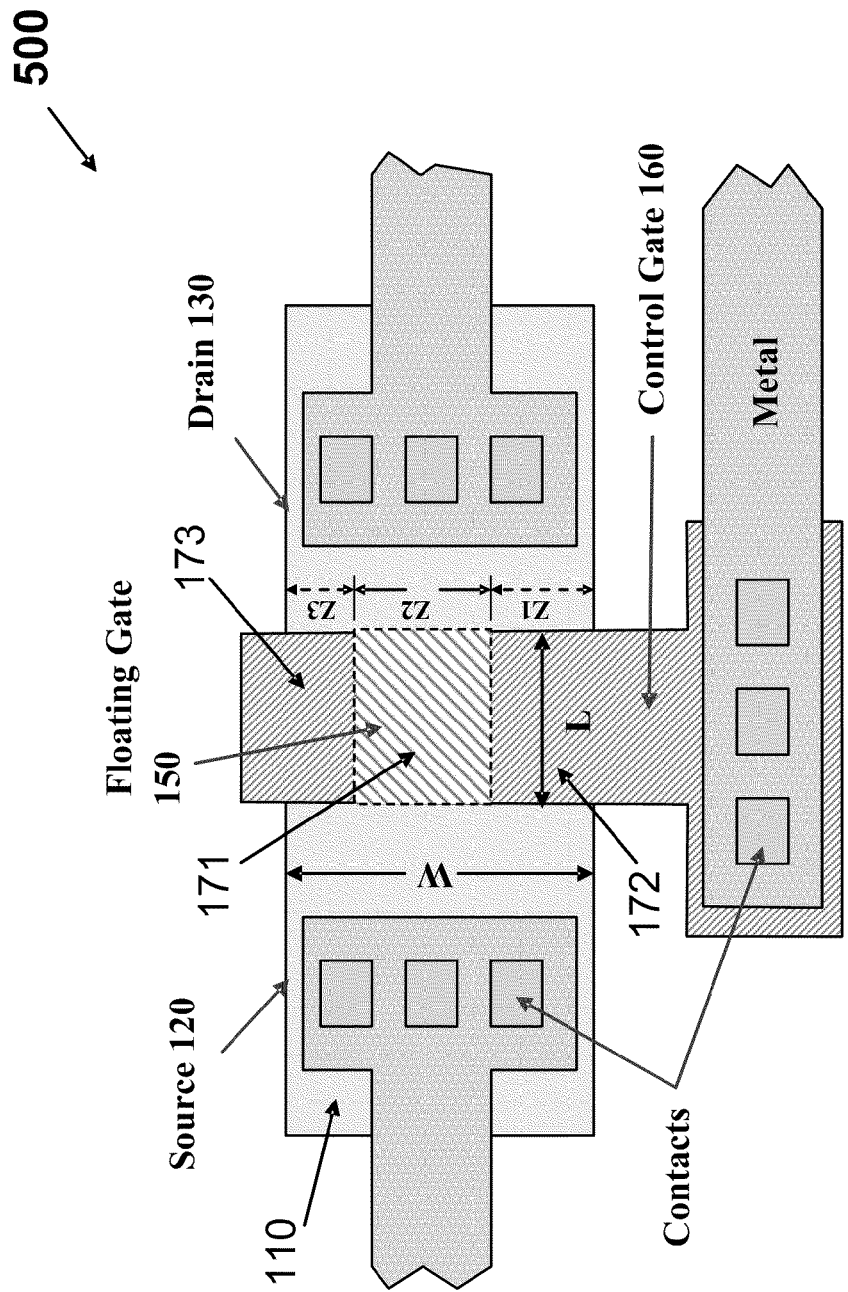
FIG. 5 layout

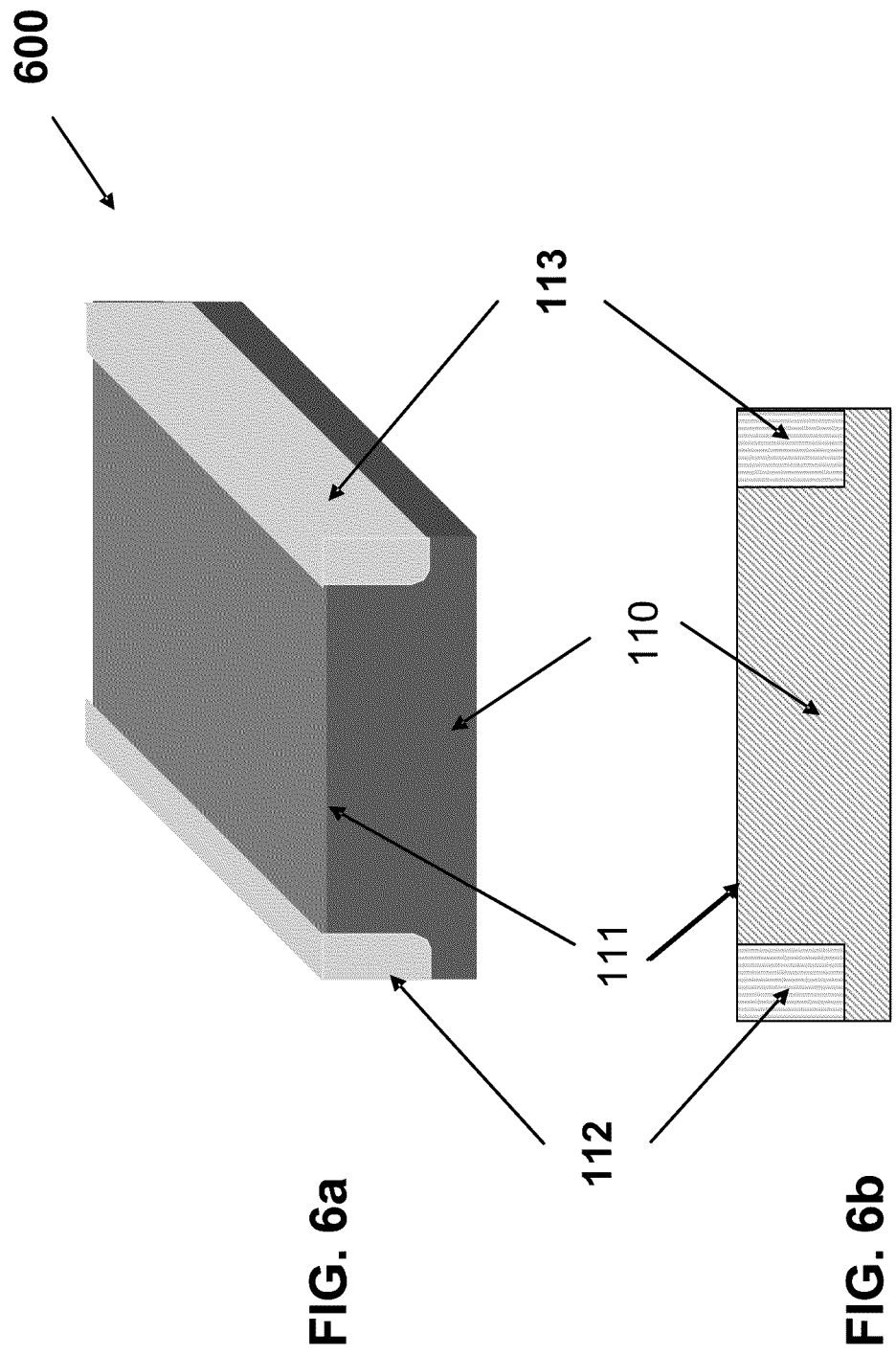

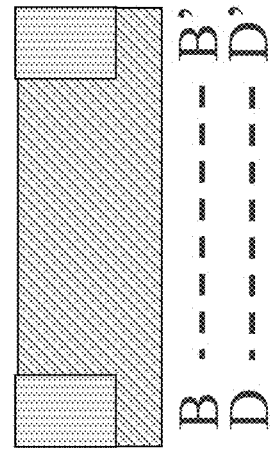
FIG. 7d
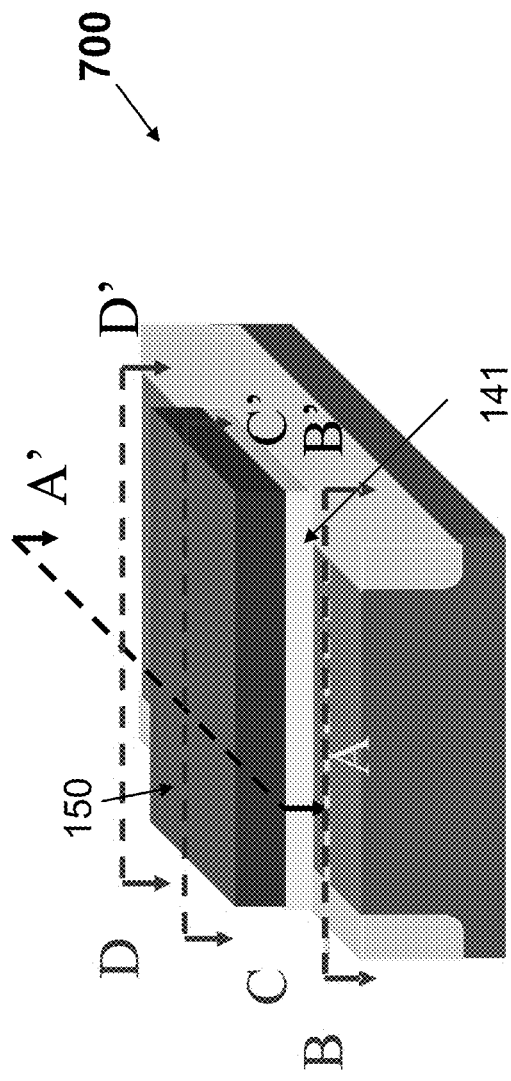
FIG. 7a
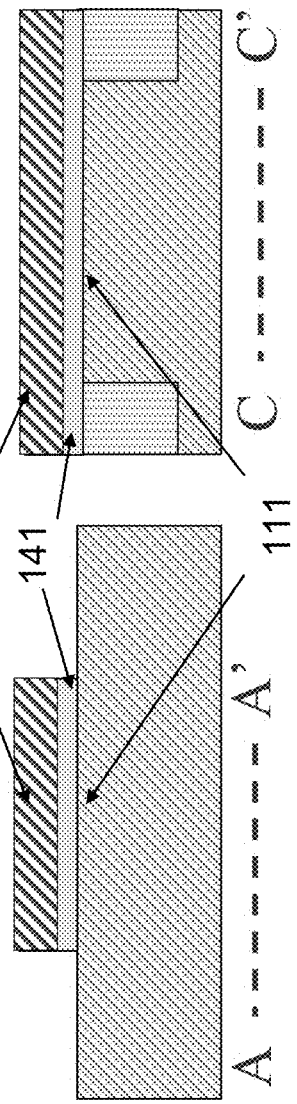
FIG. 7c
FIG. 7b

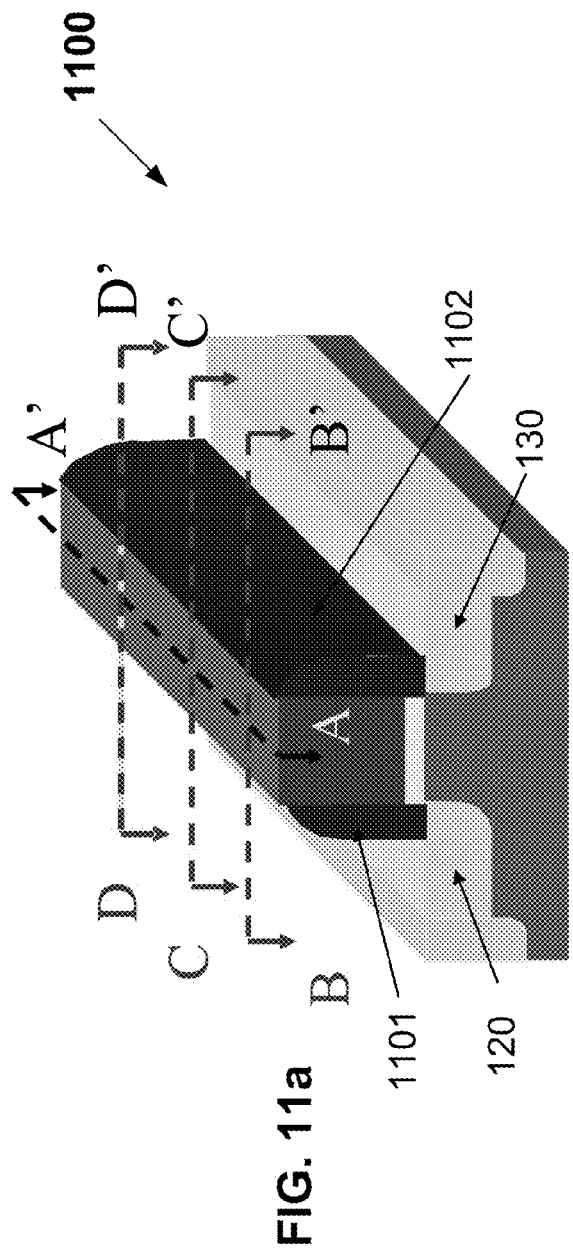
FIG. 11a
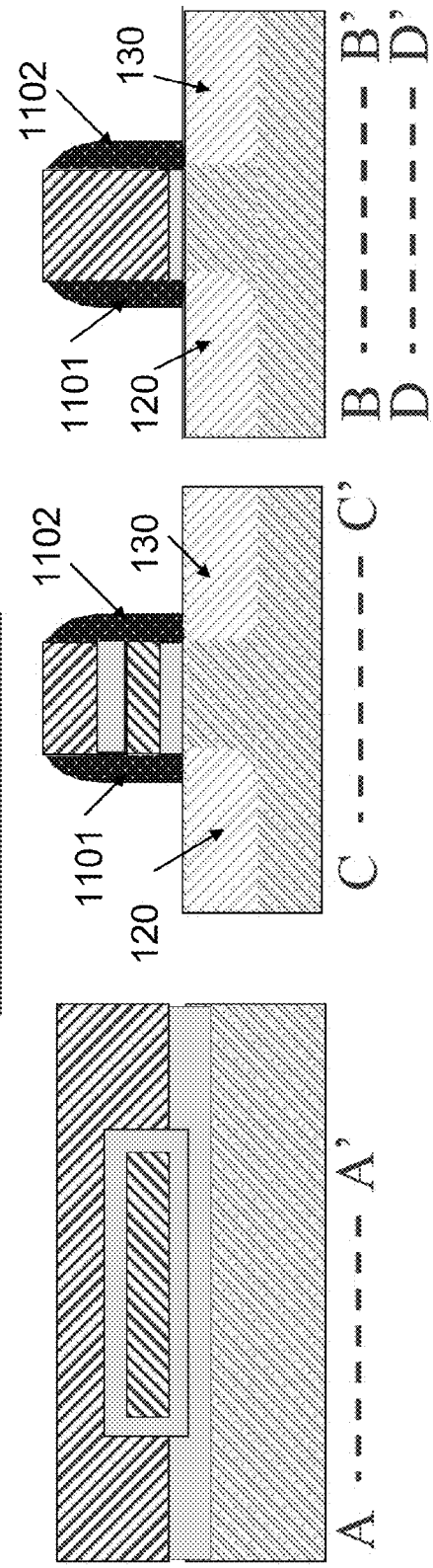
FIG. 11b
FIG. 11c
FIG. 11d

3-D ELECTRICALLY PROGRAMMABLE AND ERASABLE SINGLE-TRANSISTOR NON-VOLATILE SEMICONDUCTOR MEMORY DEVICE

CROSS-REFERENCES TO RELATED APPLICATIONS

This application claims priority to Chinese Patent Application No. 200910195983.8, filed Sep. 18, 2009, commonly assigned and incorporated in its entirety by reference herein for all purposes.

BACKGROUND OF THE INVENTION

The present invention is directed to integrated circuits and their processing for the manufacture of semiconductor devices. More particularly, the invention provides a method and device for a non-volatile memory device including a channel region for providing carriers to a second channel region for injecting into the floating gate. Merely by way of example, the invention has been applied to embedded non-volatile memory devices having high programming efficiency and low erase voltage. But it would be recognized that the invention has a much broader range of applicability. For example, the invention can be applied to integrated circuits for stand-alone non-volatile memories or memory card applications.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is non-volatile memory devices for the manufacture of integrated circuits in a cost effective and efficient way.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor International Manufacturing Company (SMIC) of Shanghai, China is an example of a chip company that performs foundry services. Although fabless chip companies and foundry services have increased through the years, many limitations still exist. For example, as logic devices are scaled and designed to operate under lower voltages, non-volatile memory devices are difficult to scale down and continue to need high voltages to operate.

For example, a conventional stacked gate non-volatile memory device requires only a single transistor for each cell, but it requires high programming current which makes it difficult to utilize on-chip high voltage generation for programming and erase. A conventional split gate non-volatile memory device is a single transistor electrically programmable and erasable memory cell. Erasure of the cell is accomplished by the mechanism of Fowler-Nordheim tunneling from the floating gate through the second insulating layer to the control gate. Programming is accomplished by electrons from the source migrating through the channel region underneath the control gate and then by abrupt potential drop injecting through the first insulating layer into the floating gate. This device can suffer from difficulty in further scaling down and low manufacturability yield. These and other limitations are described throughout the present specification and more particularly below.

From the above, it is seen that an improved technique for processing semiconductor devices is desired.

BRIEF SUMMARY OF THE INVENTION

According to the present invention, techniques directed to integrated circuits and their processing are provided for the manufacture of semiconductor devices. More particularly, the invention provides a method and device for a non-volatile memory device including a channel region for providing carriers to a second channel region for injecting into the floating gate. Merely by way of example, the invention has been applied to embedded non-volatile memory devices having high programming efficiency and low erase voltage. But it would be recognized that the invention has a much broader range of applicability. For example, the invention can be applied to integrated circuits for stand-alone non-volatile memories or memory card applications.

In a specific embodiment of the invention, a non-volatile memory device is provided. The device includes a semiconductor substrate including a surface region and a gate dielectric layer overlying the surface region. The device includes a source region within a first portion of the semiconductor substrate and a drain region within a second portion of the semiconductor substrate. The device also includes a separation region between the source region and the drain region, the separation region having a length and a width. In an embodiment, an area is formed by the length and the width, The area spans between the source region and the drain region, the length provided between a first length region to a second length region, the width provided between a first width region and a second width region. The device further includes a channel region within an inner portion of the area, the channel region provided between the source region and the drain region and extending from the first length region to the second length region. A floating gate structure is provided overlying the channel region and not extending outside of the channel region. An oxide on nitride on oxide structure overlies the floating gate structure. The device also includes a control gate layer covering an entirety of the floating gate structure and overlying the entirety of the area including the first length region to the second length region, including the first width region to the second width region.

In a specific embodiment, the width ranges from about 1 nanometer to 30 microns. In an embodiment, the floating gate is characterized by a width ranging from 1 nanometer to 10 microns. In an embodiment, the length ranges from about 1 to 200 nanometers. In another embodiment, the length is at least 10 nanometers. In an embodiment, the channel region is not extending from the first width region to the second width region. In an embodiment, the floating gate structure comprises an in-situ doped silicon layer.

In an alternative embodiment, the invention provides a non-volatile memory device including a semiconductor substrate having a surface region. The device includes a source region within the semiconductor substrate and a drain region within the semiconductor substrate. The device also includes a first channel region within the semiconductor substrate. The first channel region extends between a first portion of the source region and a first portion of the drain region. The device further includes a second channel region within the semiconductor substrate. The second channel region extends between a second portion of the source region and a second portion of the drain region. The device includes a first dielectric layer over the first channel region and a second dielectric layer over the second channel region. A floating gate structure is formed to overlie the first dielectric layer over the first channel region. The device includes a third dielectric layer overlying the floating gate structure. The device also includes a control gate layer overlying the second dielectric layer and the third dielectric layer. In an embodiment, the second channel region provides electric carriers to the first channel region during a programming operation of the non-volatile memory device.

In a specific embodiment, the device also includes a third channel region within the semiconductor substrate. The third channel region extends between a third portion of the source region and a third portion of the drain region. The device includes a fourth dielectric layer over the third channel region, the fourth dielectric layer being under the control gate layer. The fourth channel region provides electric carriers to the first channel region during a programming operation of the non-volatile memory device. In a specific embodiment, a length of the first channel region is about 70 nanometers and greater. In an embodiment, a width of the first channel region ranges from about 3 nanometers to 30 microns. In certain embodiment, a length of the first channel region ranges from about 1 to 200 nanometers. In an embodiment, the floating gate structure comprises an in-situ doped silicon layer.

In another embodiment, the invention provides a method of making a non-volatile memory device. The method includes providing a semiconductor substrate including a surface region. The method includes forming a source region and a drain region within the semiconductor substrate. The method forms a first channel region and a second channel region within the semiconductor substrate. The first channel region extends between a first portion of the source region and a first portion of the drain region. The second channel region extends between a second portion of the source region and a second portion of the drain region. The method also includes forming a first dielectric layer over the first channel region and forming a second dielectric layer over the second channel region. The method forms a floating gate structure overlying the first dielectric layer over the first channel region. The method forms a third dielectric layer over the floating gate structure. The method also includes forming a control gate structure overlying the second dielectric layer and the third dielectric layer.

In a specific embodiment, the method also includes forming a third channel region within the semiconductor substrate, the third channel region extending between a third portion of the source region and a third portion of the drain region, and forming a fourth dielectric layer over the third channel region, the fourth dielectric layer being under the control gate layer. In a specific embodiment, a width of the first channel region ranges from about 1 nanometer to 30 microns. In an embodiment, the floating gate is characterized by a width ranging from 1 nanometer to 10 microns. In an embodiment, a length of the first channel region ranges from about 1 to 200 nanometers. In another embodiment, the length of the first channel region is at least 10 nanometers. In an embodiment, the floating gate structure comprises an in-situ doped silicon layer.

In an alternative embodiment of the invention, a non-volatile memory apparatus is provided. The apparatus includes a memory array including a plurality of memory cells, a common source line, a plurality of word lines, and a plurality of bit lines. Each combination of one of the plurality of word lines and one of the plurality of bit lines selects a different one of the plurality of memory cells. Each of the plurality of memory cells includes a source region coupled to the common source line, a drain region coupled to an associated one of the plurality of bit lines, and a channel region between the source region and the drain region. The channel region is characterized by a length extending from the source region to the drain region. The channel region is also characterized by a channel width in the direction perpendicular to the channel length direction. The memory cell also includes a floating gate positioned between the source and the drain in the channel length direction. The floating gate has a top surface and a side surface. The floating gate is characterized by a floating gate width that is less than the channel width. The memory cell also includes a control gate coupled to an associated one of the plurality of word lines. The control gate covers the top surface and the side surface of the floating gate. The control gate also overlies an entirety of the channel region. The memory cell also includes a first voltage line for supplying a first voltage to the drain region and a second voltage line for supplying a second voltage to the control gate. The first voltage and the second voltage cause a gradient in electron distribution in the channel region along the channel width direction and also cause an abrupt potential drop in the channel region under the floating gate. The second voltage line also supplies an erase voltage to the control gate for causing Fowler-Nordheim tunneling of electrons from the floating gate to the control gate.

Numerous benefits are achieved using one or more features of the present invention. In a specific embodiment, the present invention can provide a conducting channel adjacent to a stacked gate channel to supply carriers during programming, resulting in low programming voltage requirement. In some embodiments, corner structures on the floating gate facilitates electron tunneling and lowers erase voltage requirement. Lower voltage requirements make it easier to implement on-chip charge pump circuits. In certain embodiments, the device structure has a short channel length and is amenable for further scaling for improved device performance. Depending upon the specific embodiment, the invention also provides a method that is implemented using conventional process technology and equipment. Depending upon the embodiment, one or more of these benefits may be achieved. These and other benefits are described throughout the present specification and more particularly below.

BRIEF DESCRIPTION OF THE DRAWINGS

FIG. 1a-1d are simplified diagrams of a non-volatile memory device according to an embodiment of the present invention;

FIG. 2a-2c are simplified diagrams of a programming method for a non-volatile memory device according to an embodiment of the present invention;

FIG. 5 is a simplified layout diagram of a non-volatile memory device according to an embodiment of the present invention; and FIGS. 6a-12d are simplified view diagrams illustrating a method for making a non-volatile memory device according to an embodiment of the present invention.

DETAILED DESCRIPTION OF THE INVENTION

Figure 1A:
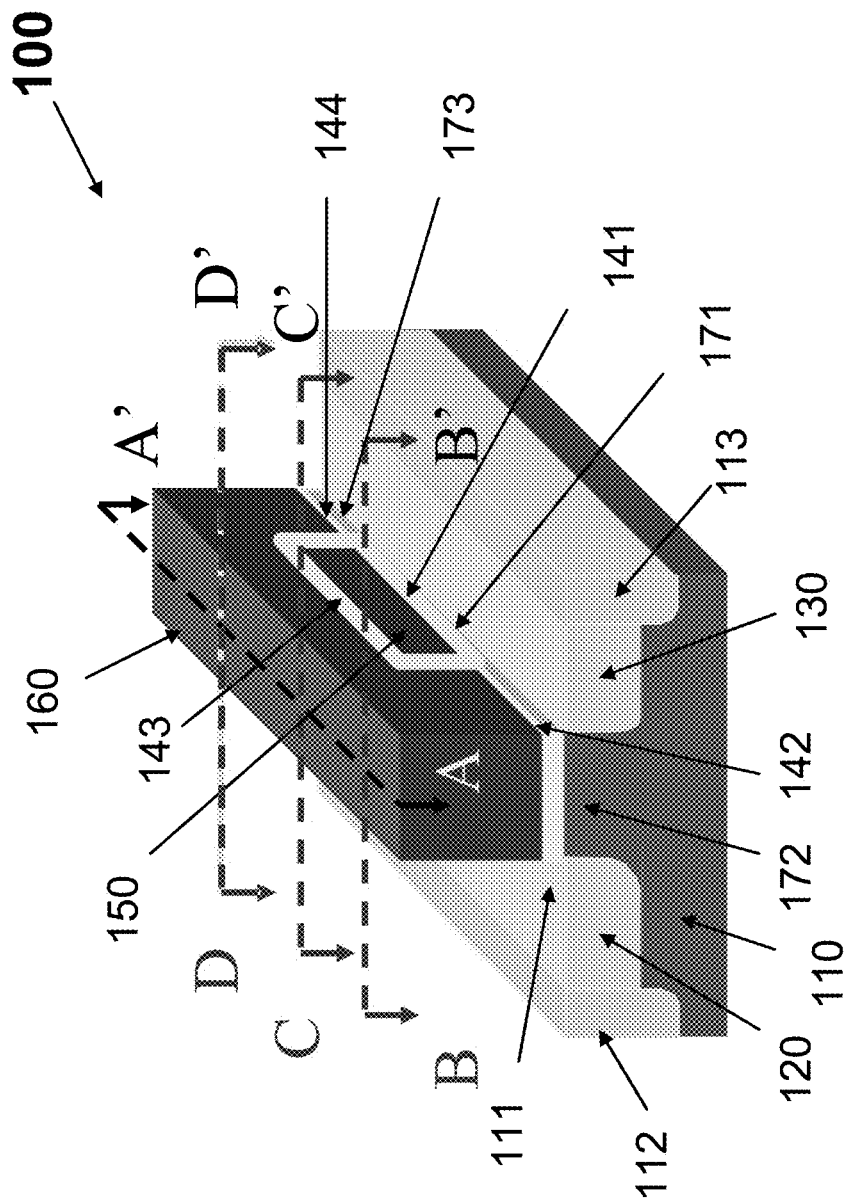

FIG. 1a is a simplified diagram of a non-volatile memory device 100 according to an embodiment of the present invention. This diagram is merely an example, which should not unduly limit the scope of the claims herein. One of ordinary skill in the art would recognize other variations, modifications, and alternatives. As shown, non-volatile memory device 100 includes a substrate 110, a surface region of the substrate 111, and isolation regions 112 and 113 in the substrate. In an embodiment, isolation regions can be shallow trench isolation (STI) regions or conventional LOCOS isolation regions, or other types of isolation regions such as junction isolation regions. Device 100 also includes a source region 120 and a drain region 130 within the substrate. In a specific embodiment, the source region and drain region are heavily doped regions. Between the source region and the drain region, device 100 also includes channel regions such as 171, 172, and 173. Each of the channel regions 171, 172, and 173 extends between a portion of the source region to a corresponding portion of the drain region. Each channel region includes impurities to adjust threshold voltages. Device 100 also includes dielectric layers 141, 142, and 144. Dielectric layer 141 overlies channel region 171, dielectric layer 142 overlies channel region 172, and dielectric layer 144 overlies channel region 173. A cross-sectional view of the channel regions and dielectric layers is shown in FIG. 1b.

In a specific embodiment, a floating gate structure 150 is formed over dielectric layer 171. Dielectric layer 143 is formed over the floating gate. In an embodiment, dielectric layer 143 is an oxide-nitride-oxide layer. In a specific embodiment, dielectric layer 143 also includes insulator layers on the sides of the floating gate. In an embodiment, the insulator layers on the sides of the floating gate include oxide-nitride-oxide layers. In other embodiments, dielectric layer 143 can also include insulator spacers, such as oxide or nitride or their combinations, on the sides of the floating gate. Non-volatile memory device 100 also includes a control gate 160 overlying dielectric layers 142, 143, and 144. Various components of non-volatile device 100 are further illustrated in FIG. 1b, 1c, and 1d.

FIG. 1b is a simplified cross-sectional view diagram of non-volatile memory device 100 according to an embodiment of the present invention. This diagram is merely an example, which should not unduly limit the scope of the claims herein. One of ordinary skill in the art would recognize other variations, modifications, and alternatives. As shown, a cross-sectional view diagram along lines AA' of device 100 includes substrate 110, dielectric layers 141, 142, and 144 over channel regions 171, 172, and 173, respectively. Floating gate 150 is over the dielectric layer 141. Control gate 160 overlies dielectric layer 143, which is formed over the floating gate.

FIG. 1c is a simplified cross-sectional view diagram of non-volatile memory device 100 according to an embodiment of the present invention. This diagram is merely examples, which should not unduly limit the scope of the claims herein. One of ordinary skill in the art would recognize other variations, modifications, and alternatives. As shown, a cross-sectional view diagram along lines BB' (or DD') of device 100 illustrates an MOS transistor device including source 120, drain 130, channel region 172 along BB' cross section (or channel region 173 along the DD' cross section), dielectric layer 142 along the BB' cross section (or dielectric layer 144 along the DD' cross section), and control gate 160 over the dielectric layer.

FIG. 1d is a simplified cross-sectional view diagram of non-volatile memory device 100 according to an embodiment of the present invention. This diagram is merely an example, which should not unduly limit the scope of the claims herein. One of ordinary skill in the art would recognize other variations, modifications, and alternatives. As shown, a cross-sectional view diagram along lines CC' of device 100 illustrates a floating gate non-volatile memory device including source region 120, drain region 130, channel region 171, dielectric layer 141, floating gate 150 over dielectric layer 141, dielectric lay 143 over the floating gate, and control gate 160 over the dielectric layer 143. As shown, FIGS. 1a-1d are simplified diagrams of an example of a non-volatile memory device according to an embodiment of the present invention. One of ordinary skill in the art would recognize other variations, modifications, and alternatives.

FIG. 2a-2c are simplified diagrams illustrating programming operations 200 for a non-volatile memory device according to an embodiment of the present invention. These diagrams are merely examples, which should not unduly limit the scope of the claims herein. One of ordinary skill in the art would recognize other variations, modifications, and alternatives. As shown in FIG. 2a, if the control gate 160 is raised to a voltage above a threshold voltage, the channel region directly beneath the control gate, such as channel region 172 or 173, is slightly turned on. Since part of the control gate voltage is coupled to the floating gate, channel 171 is also formed under the floating gate. As shown in FIG. 2b, when a high voltage is applied to the drain 130, a sub-threshold electron current will begin to flow from source region 120 to drain region 130. As shown in FIG. 2a, there is a gradient of electron distribution between adjacent channel regions 172 and 171, as well as between channel regions 173 and 171. The electrons will diffuse into channel region 171 under the floating gate 150 (FIG. 2c), where the electrons are accelerated by the steep potential drop approximately equal to the drain voltage, and become heated. Some of the electrons can be injected into the floating gate 150 through dielectric layer 141, as a result of an attractive electrostatic force of the floating gate 150 (FIG. 2c). The floating gate is programmed as it accumulates the injected electrons. In an embodiment, the programming process continues until the positive charges on the floating gate are neutralized by the injected electrons, and the electric potential on the floating gate can no longer sustain an induced surface channel immediately beneath the floating gate. Alternatively, the programming process can also be terminated by removing the voltages applied to the control gate and the drain region. According to a specific embodiment of the invention, the electrons from adjacent conducting channels are provided into the channel region under the floating gate for injection into the floating gate. Enhanced Programming efficiency is obtained over conventional floating gate non-volatile memory devices. In certain embodiments, the improved programming efficiency can lower the requirement for high programming voltage and simplify the design of on-chip charge pump circuits.

Figure 3:
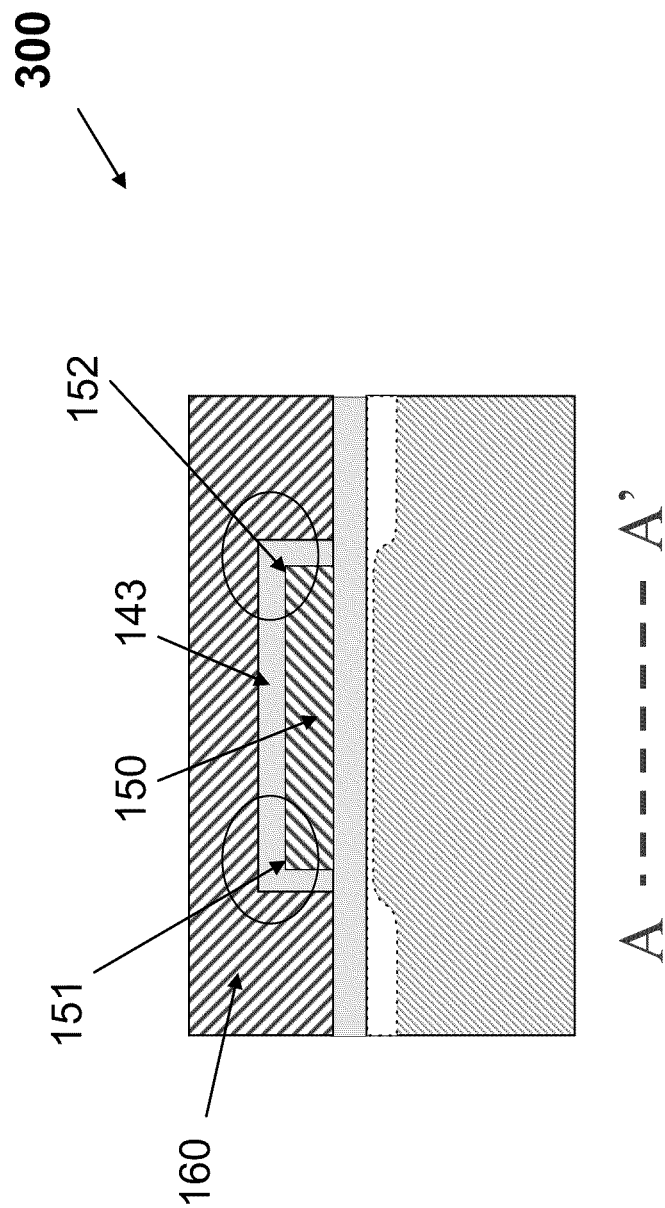
FIG. 3 is a simplified diagram of an erase method for a non-volatile memory device according to an embodiment of the present invention.

FIG. 3 is a simplified diagram of an erase method 300 for a non-volatile memory device according to an embodiment of the present invention. This diagram is merely an example, which should not unduly limit the scope of the claims herein. One of ordinary skill in the art would recognize other variations, modifications, and alternatives. In an embodiment, during an erase operation, a ground potential is applied to the drain region and the source region of non-volatile device 100. A high positive voltage, on the order of +12 volts, is applied to the control gate 160. Charges on the floating gate are induced through Fowler-Nordheim (FN) tunneling mechanism to tunnel through dielectric layer 143 to the control gate. Continuing this erase operation can leave the floating gate positively charged. In a specific embodiment, a high electric field is created near the upper corners 151 and 152 of the floating gate as shown in FIG. 3, making FN tunneling more effective. In this case, the erase operation can be accomplished with a lower applied voltage.

Figure 4:
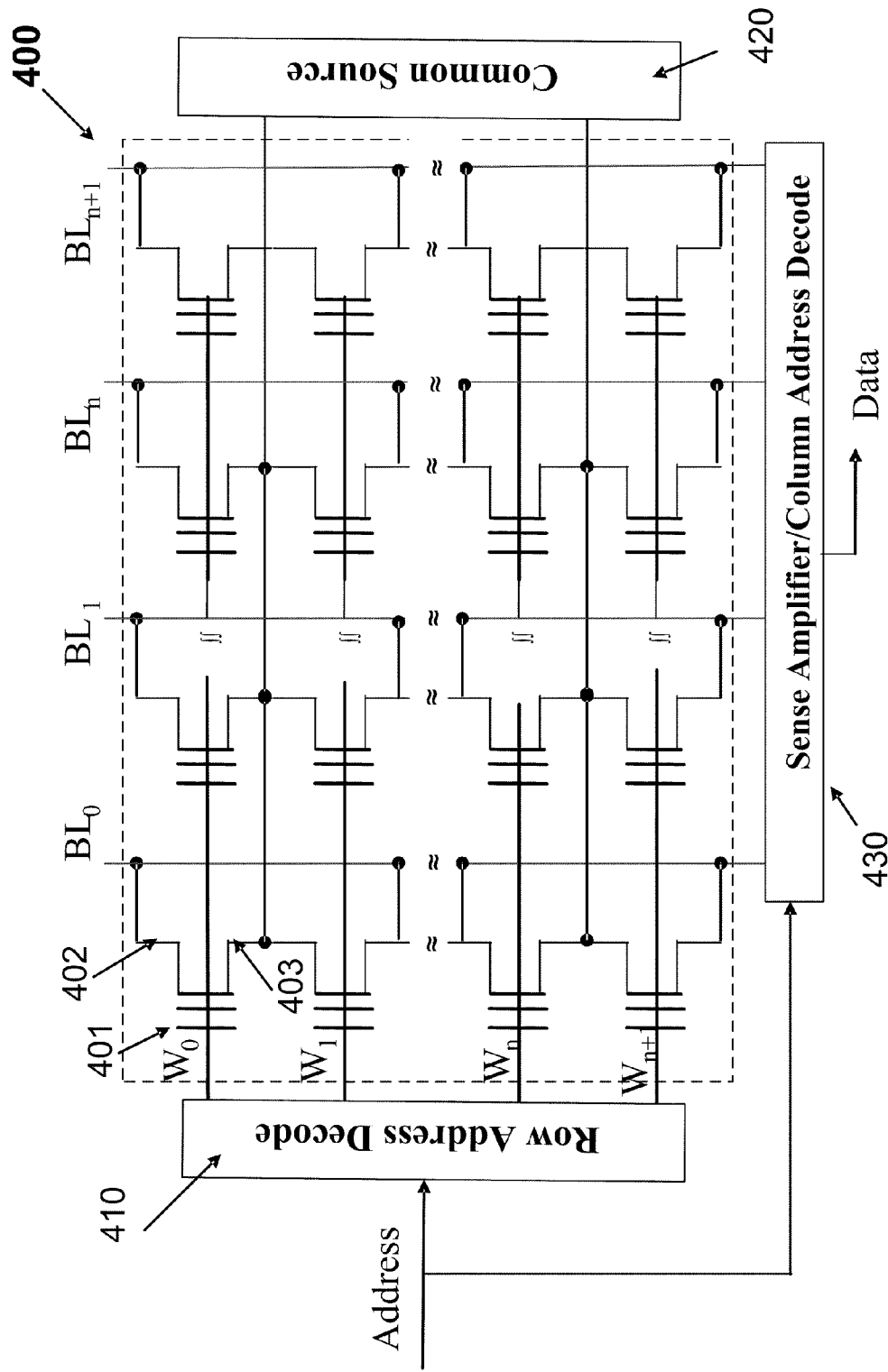
FIG. 4 is a simplified diagram of a non-volatile memory array according to an embodiment of the present invention.

FIG. 4 is a simplified diagram of a non-volatile memory array 400 according to an embodiment of the present invention. This diagram is merely an example, which should not unduly limit the scope of the claims herein. One of ordinary skill in the art would recognize other variations, modifications, and alternatives. As shown, memory array 400 includes a plurality of memory devices, such as memory device 100 discussed above. Word lines $W_0, W_1, \ldots, W_n$, and $W_{n+1}$ are connected to the control gates, such as 401, of the memory devices, according to an embodiment of the invention. Bit lines $BL_0, BL_1, \ldots BL_n$, and $BL_{n+1}$ are connected to the drain regions, such as 402, of the memory devices. The bit lines are also connected to sense amplifier circuit block 430. The source regions of the memory devices, such as 403, are connected to a common source terminal 420. As shown, Address data are connected to Row Address Decoder 410 to select the word lines. Column Address Decoder 430 selects the bit lines to be sensed by the sense amplifier (also in 430). One of ordinary skill in the art would recognize other variations, modifications, and alternatives.

In a specific embodiment, the sensing of the state of the memory cell or the memory array can be accomplished as follows. The source is maintained at a ground potential. The drain is maintained at a read voltage, which is typically +2 volts and is much smaller than the programming potential. If the floating gate is positively charged, then the channel region directly beneath the floating gate is normally turned on. When the control gate is raised to a read potential, e.g., +5.0 volts, to turn on the portion of the channel underneath the floating gate, the channel regions under the control gate are also turned on. Electrical current will flow from the drain to the source. In this manner, the memory cell can be sensed at an erased state or "1" state. On the other hand, if one of the floating gate is negatively charged, the region of the channel directly beneath the floating gate is either weakly turned on or entirely shut off Even though the channel regions directly under the control gate are also turned on, the current through the channel is small compared to the erased "1" state. Under this condition, the cell is sensed to be in a programmed state of "0". Of course, there are other variations, modifications, and alternatives.

FIG. 5 is a simplified layout diagram of a non-volatile memory device 500 according to an embodiment of the present invention. This diagram is merely an example, which should not unduly limit the scope of the claims herein. One of ordinary skill in the art would recognize other variations, modifications, and alternatives. As shown, device 500 includes a semiconductor substrate 110 and a gate dielectric layer overlying the substrate (not shown). Source region 120 is formed within a first portion of the substrate, and drain region 130 is formed in a second portion the substrate. The source region and drain region are separated by a separation region having a length L and a width Z1+Z2+Z3. The separation region has an area that is equal to L*(Z1+Z2+Z3). A first channel region 171 is formed within an inner portion of the area between the source region and the drain region and extending the length L. Floating gate 150 is formed overlying the first channel region 171. In an embodiment, the floating gate does not extend outside the first channel region. Control gate layer 160 covers an entirety of the floating gate structure and overlying the entire area of length L and width Z1+Z2+Z3. Channel regions 172, 173 are under the control gate. As shown, Z1, Z2, and Z3 designate the widths of channel regions 171, 172, and 173, respectively. In an embodiment, each of the widths can have values between about 1 nm to about 10 um. In an embodiment, a total width Z1+Z2+Z3 of the channel regions can be about 5 nm to 12 um. In other embodiments, the total width Z1+Z2+Z3 of the channel regions can range from about 1 nm to about 30 um. In a specific embodiment, each of channel regions 171, 172, and 173 can have a length of about 1 nm to 200 nm. In other embodiments, the length of each of the channel regions is about 70 nanometers or greater. As shown in FIG. 5, the drain region, source region, and control gate are connected to respective metal interconnects through contact structures. In a specific embodiment, an oxide on nitride on oxide structure (not shown in FIG. 5) overlies the floating gate structure. Of course, there can be other variations, modifications, and alternatives.

A method for fabricating an integrated circuit device according to an embodiment of the present invention may be outlined as follows:

1. Provide silicon substrate with isolation regions and threshold voltage implant;
2. Form floating gate layer, including thin dielectric layer;
3. Form control gate layer;
4. Define gate electrodes;
5. Form LDD regions
6. Form spacers;
7. Form source and drain regions; and
8. Form silicide and contact.

The above sequence of steps provides a method for fabricating an integrated circuit including a non-volatile memory device according to an embodiment of the present invention. As shown, the method uses a combination of steps including a way of fabricating a non-volatile memory device having a separate channel region providing carriers into a second channel under a floating gate. Other alternatives can also be provided where steps are added, one or more steps are removed, or one or more steps are provided in a different sequence without departing from the scope of the claims herein. Further details of the present method can be found in FIGS. 6a-12d which are simplified view diagrams illustrating a method for making a non-volatile memory device according to an embodiment of the present invention.

FIGS. 6a and 6b are simplified view diagrams of as tep 600 for making a non-volatile memory device according to an embodiment of the present invention. FIG. 6a is a 3-D view diagram, and FIG. 6b is a cross sectional view diagram. These diagrams are merely examples, which should not unduly limit the scope of the claims herein. One of ordinary skill in the art would recognize other variations, modifications, and alternatives. As shown, the method according to an embodiment of the invention starts by providing a silicon substrate 110 including a surface region 111 and forms isolation regions 112 and 113 in the substrate to separate active device areas. In a specific embodiment, the isolation regions are shallow trench isolation (STI) regions. A shallow trench isolation (STI) region can be formed by a conventional process, including active area oxide formation, active area nitride deposition, anti-reflective coating (DARC) layer deposition, and active area photolithography. In an embodiment, a silicon nitride film is deposited at a temperature range of approximately 700-800° C. to a thickness of about 100-500 nm. Of course, there can be other variations, modifications, and alternatives. Photoresist layers are usually used to define active areas between isolation regions. In an embodiment, deep UV (DUV) lithography is used for exposure. The nitride layer, oxide layer, and silicon trench regions are then etched to define isolation regions. A liner oxide is grown on the surfaces of the shallow trenched. High density plasma (HDP) deposited oxide is used to fill the trenches. Chemical mechanical polishing (CMP) is then performed to planarize the deposited oxide. At this point, the nitride cap layer is removed. A sacrificial oxide layer is deposited, and threshold adjustment implant (Vt implant) is carried out. In an embodiment, channel doping concentration can be about $1\times10^{16}$ to about $5\times10^{17}/cm^3$. In a specific embodiment, threshold adjustment implant is performed using boron containing impurities at a dose of about $1-5\times10^{12}/cm^2$ and an implantation energy of 10-30 KeV. These implant conditions are merely an examples, which should not unduly limit the scope of the claims herein. One of ordinary skill in the art would recognize other variations, modifications, and alternatives.

FIGS. 7a-7d are simplified view diagrams of a step 700 for making a non-volatile memory device according to an embodiment of the present invention. FIG. 7a is a 3-D view diagram, and FIGS. 7b-7d are cross sectional view diagrams taken along the cross sections as indicated in FIG. 7a. These diagrams are merely examples, which should not unduly limit the scope of the claims herein. One of ordinary skill in the art would recognize other variations, modifications, and alternatives. As shown, the sacrificial oxide layer is removed and a gate dielectric layer 141 is formed in the surface region 111 of the silicon substrate. The method also includes forming a polysilicon floating gate layer 150 on the gate dielectric layer and patterning the polysilicon floating gate layer.

In an embodiment, forming the gate dielectric includes the following steps:
1. Base oxide growth with in-situ steam-generated (ISSG) or rapid thermal oxidation (RTO) at a temperature range of about 700 to 900° C. to a thickness of about 0.1-3 nm;
2. Decoupled Plasma nitridation (DPN) in a nitrogen ambient; and
3. Post nitridation anneal (PNA).

Of course, there can be other variations, modifications, and alternatives. In an embodiment, a polysilicon film 150 is deposited in a temperature range of approximately 600 to 800° C. and a thickness range of about 100-500 nm. The polysilicon film is doped in-situ with N-type impurities such as phosphorus. The floating gate polysilicon layer is then patterned. First an antireflective coating (DARC) layer, such as SiON, is deposited. Then a photoresist is layer is deposited and patterned. The polysilicon gate layer is then etched using a conventional RIE techniques. Afterwards, the photoresist layer and DARC layer are stripped.

Figure 8A:
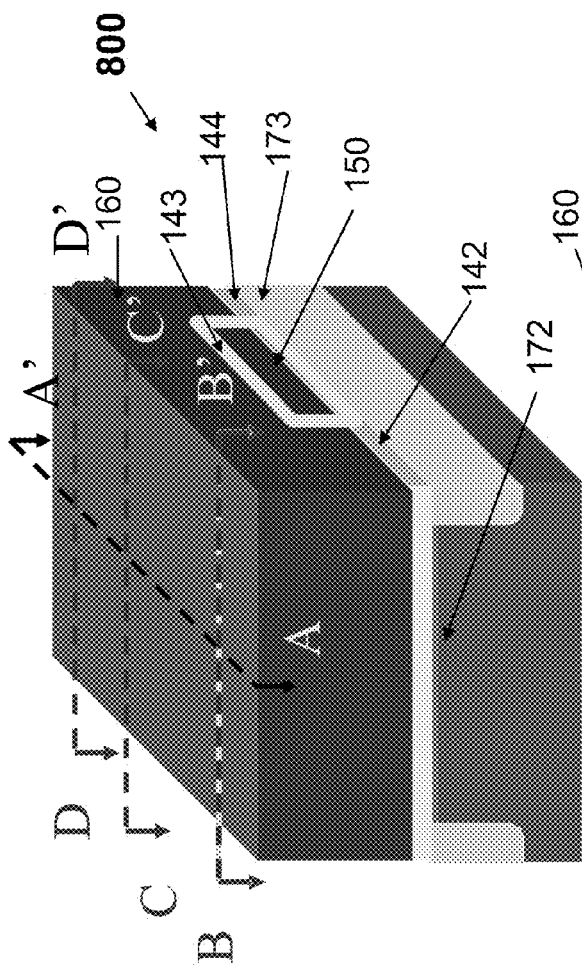
Figure 8D:
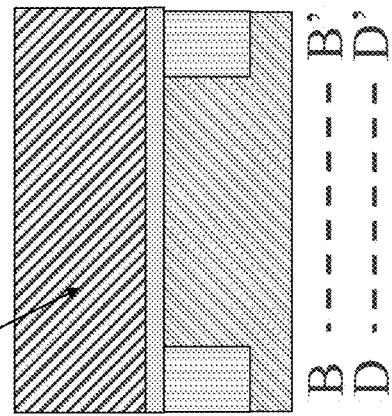
Figure 8C:
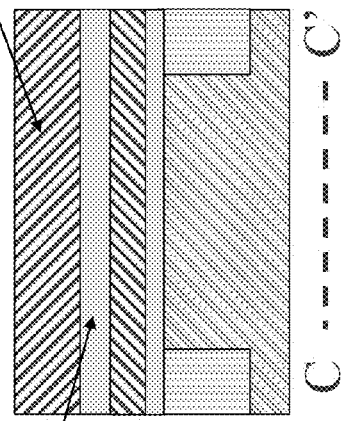
Figure 8B:
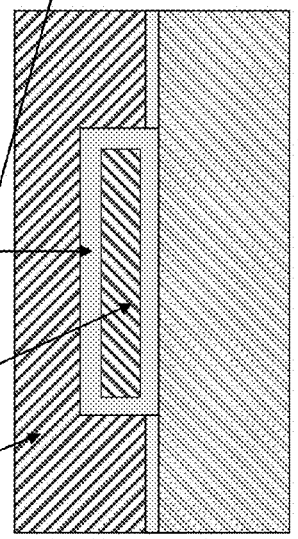

FIGS. 8a-8d are simplified view diagrams of a step 800 for making a non-volatile memory device according to an embodiment of the present invention. FIG. 8a is a 3-D view diagram, and FIGS. 8b-8d are cross sectional view diagrams taken along the cross sections as indicated in FIG. 8a. These diagrams are merely examples, which should not unduly limit the scope of the claims herein. One of ordinary skill in the art would recognize other variations, modifications, and alternatives. As shown, a control gate dielectric layer 143 is formed over the floating gate layer 150. In an embodiment, dielectric layer 143 is an oxide-nitride-oxide layer. In a specific embodiment, dielectric layer 143 also includes insulator layers on the sides of the floating gate. In an embodiment, the insulator layers on the sides of the floating gate include oxide-nitride-oxide layers. In other embodiments, dielectric layer 143 can also include insulator spacers, such as oxide or nitride or their combinations, on the sides of the floating gate. In an embodiment, an oxide-nitride-oxide layer is also formed over channel regions 172 and 173 to form dielectric layers 142 and 144, respectively. The method then deposits a control gate polysilicon layer over dielectric layers 142, 143, and 144, as shown in FIG. 8a. In an embodiment, a polysilicon film 160 is deposited in a temperature range of approximately 600 to 800° C. and a thickness range of about 100-500 nm. The polysilicon film is doped in-situ with N-type impurities such as phosphorus. After control gate polysilicon layer deposition, a CMP process is performed to planarize the polysilicon layer. An antireflective coating (DARC) is then deposited over the polysilicon layer in preparation for a photolithography step.

Figure 9A:
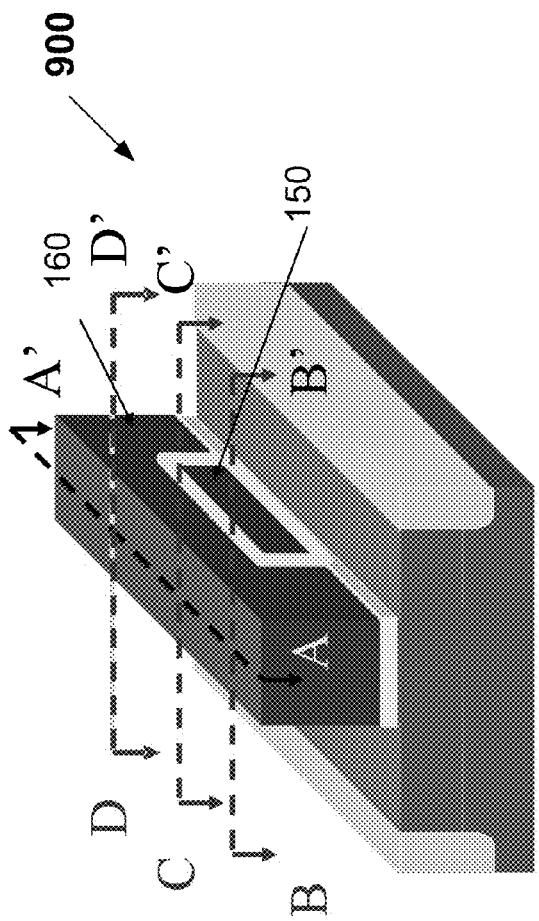
Figure 9B:
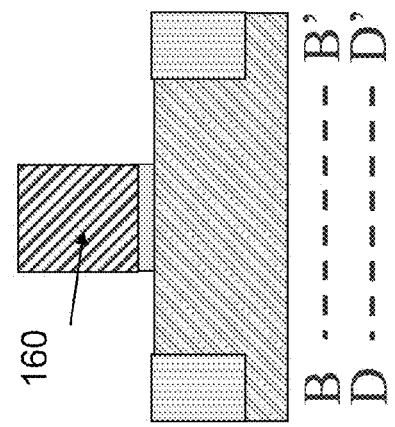
Figure 9C:
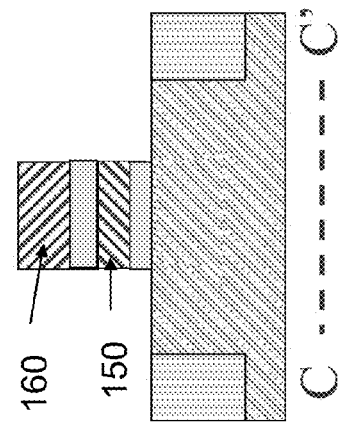
Figure 9D:
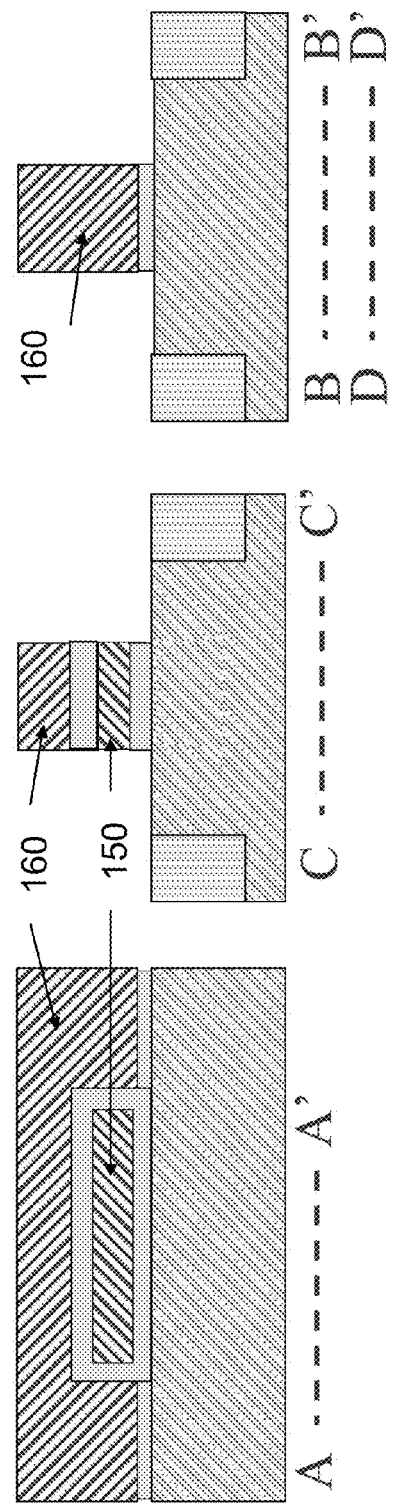

FIGS. 9a-9d are simplified view diagrams of a step 900 for making a non-volatile memory device according to an embodiment of the present invention. FIG. 9a is a 3-D view diagram, and FIGS. 9b-9d are cross sectional view diagrams taken along the cross sections as indicated in FIG. 9a. These diagrams are merely examples, which should not unduly limit the scope of the claims herein. One of ordinary skill in the art would recognize other variations, modifications, and alternatives. As shown, the control gate layer and floating gate layer are patterned and etched to form control gate 160 and floating gate 150, respectively. In a specific embodiment, conventional lithography techniques are used to define the control gate and floating gate patterns. In an embodiment, a minimum feature size can be used to define the lengths of the control gate and floating gate, which in turn define a channel length of the device. A short channel length improves device performance. Depending upon the embodiments, the channel length of device 900 can be further scaled down by using advanced lithography and etch techniques. Of course, one of ordinary skill in the art would recognize other variations, modifications, and alternatives.

Figure 10A:
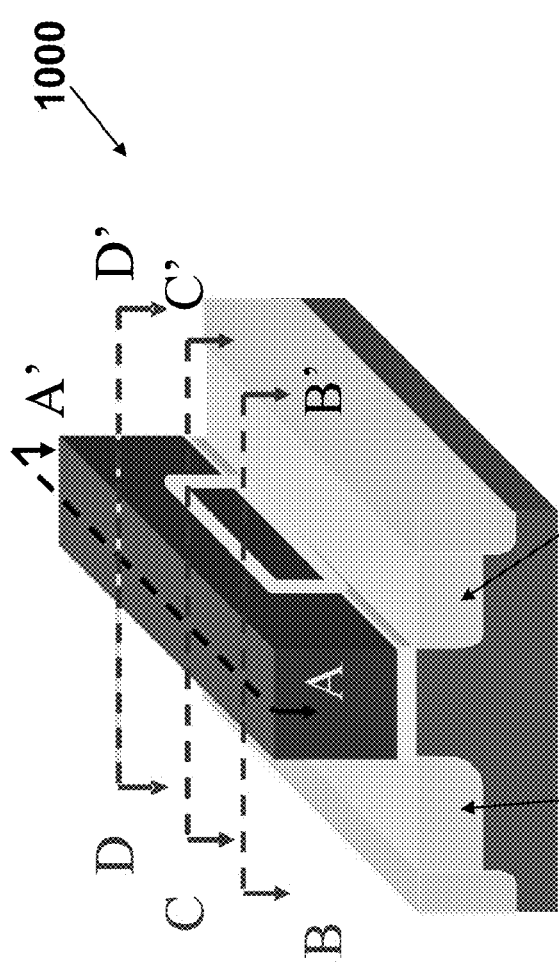
Figure 10D:
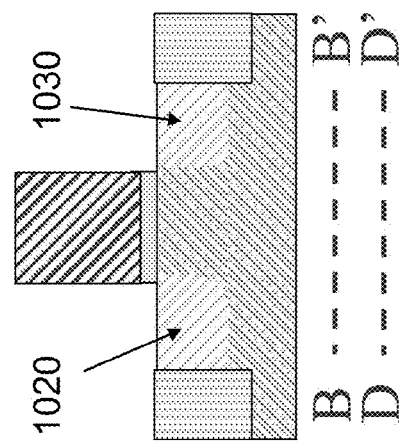
Figure 10C:
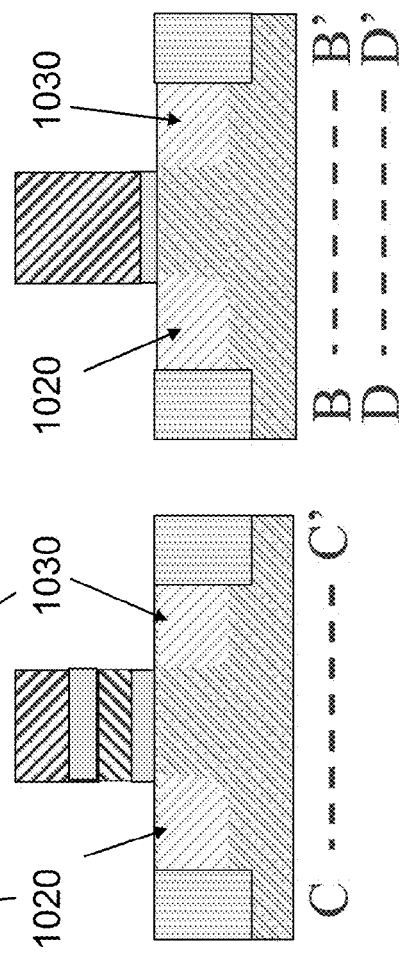
Figure 10B:
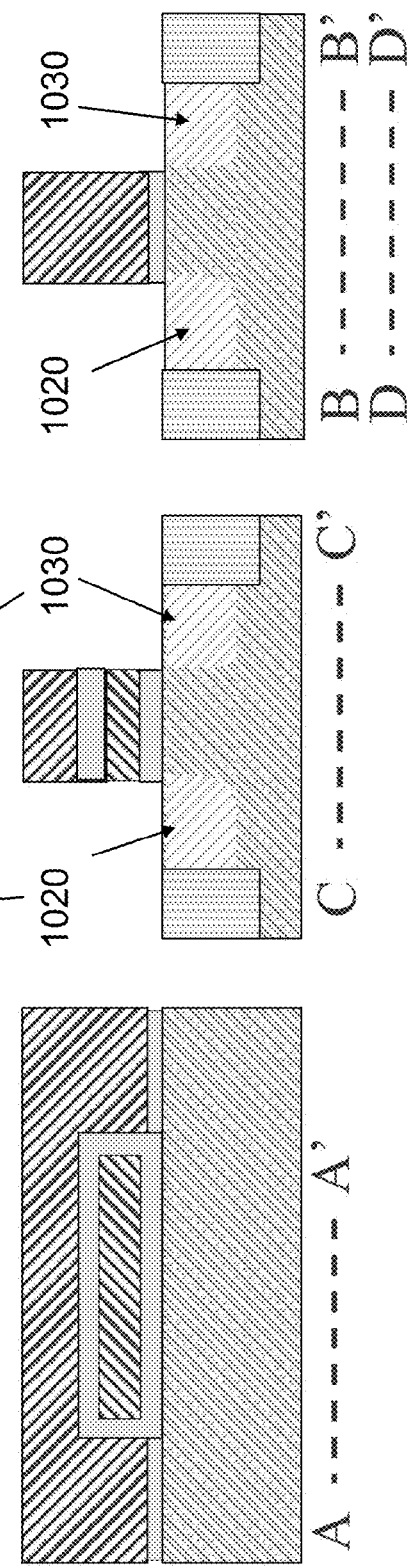

FIGS. 10a-10d are simplified view diagrams of a step 1000 for making a non-volatile memory device according to an embodiment of the present invention. FIG. 10a is a 3-D view diagram, and FIGS. 10b-10d are cross sectional view diagrams taken along the cross sections as indicated in FIG. 10a. These diagrams are merely examples, which should not unduly limit the scope of the claims herein. One of ordinary skill in the art would recognize other variations, modifications, and alternatives. As shown, after a lithography step, N-type impurities are implanted to form N-type lightly doped source and drain regions 1020 and 1030.

FIGS. 11a-11d are simplified view diagrams of a method 1100 for making a non-volatile memory device according to an embodiment of the present invention. FIG. 11a is a 3-D view diagram, and FIGS. 11b-11d are cross sectional view diagrams taken along the cross sections as indicated in FIG. 11a. These diagrams are merely examples, which should not unduly limit the scope of the claims herein. One of ordinary skill in the art would recognize other variations, modifications, and alternatives. As shown, spacer regions 1101 and 1102 are formed by a method that includes, for example, depositing an insulating layer and etch back using RIE. In an embodiment, the method forms ONO (oxide-nitride-oxide) spacers. The method first performs gate nitridation, followed by an high temperature oxidation (HTO) offset process. The method then forms a nitride spacer. The method also includes forming HTO layer and RIE etching to form spacers. The method also includes implanting impurities to form source region 120 and drain region 130. For N-type devices, the source/drain implantation includes N-type impurities such as As, at a dose of about $1\text{-}5\times10^{15}/\text{cm}^2$. Of course, there can be other variations, modifications, and alternatives.

Figure 12A:
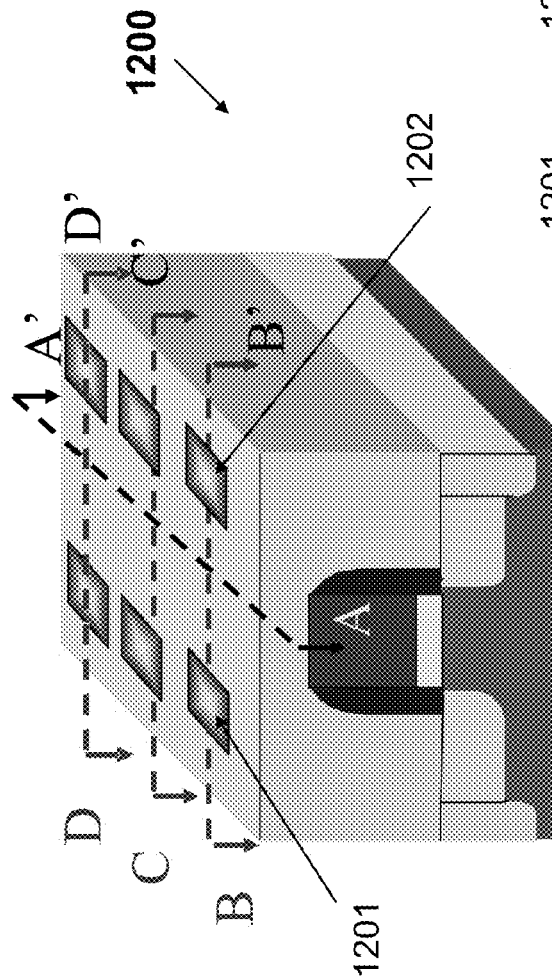
Figure 12D:
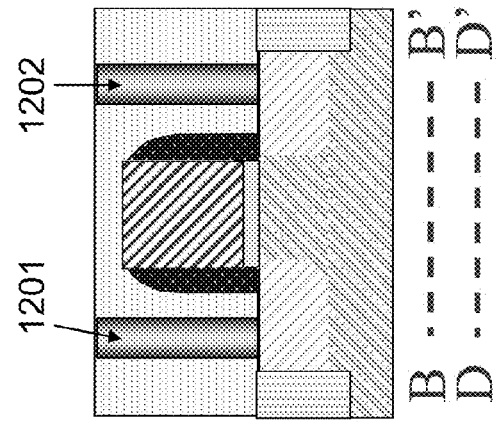
Figure 12C:
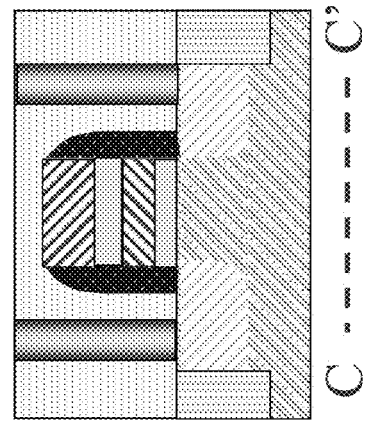
Figure 12B:
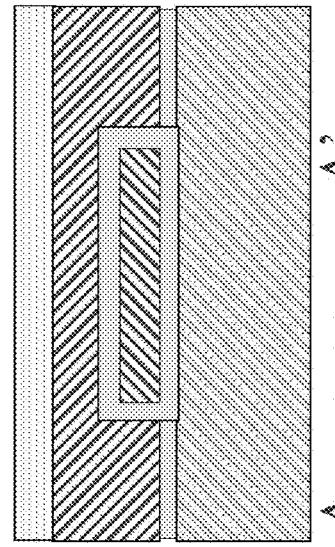

FIGS. 12a-12d are simplified view diagrams of a step 1200 for making a non-volatile memory device according to an embodiment of the present invention. FIG. 12a is a 3-D view diagram, and FIGS. 12b-12d are cross sectional view diagrams taken along the cross sections as indicated in FIG. 12a. These diagrams are merely examples, which should not unduly limit the scope of the claims herein. One of ordinary skill in the art would recognize other variations, modifications, and alternatives. A self aligned silicide layer is formed over the control gate and the source and drain regions (not shown) using a conventional process. Then interlayer dielectric (ILD) is deposited by HDP PSG or SACVD BPSG. The interlayer dielectric is then planarized using CMP. At this point, contact structures, such as 1201 and 1202 are formed as shown. In some embodiments, the contact structures are tungsten plugs. Of course, there can be other variations, modifications, and alternatives.

The above sequence of processes provides a method for making a non-volatile memory device according to an embodiment of the present invention. As shown, the method uses a combination of steps including a way of fabricating a non-volatile memory device including a channel region for providing carriers into a second channel region for injecting into the floating gate. Of course, there can be other variations, modifications, and alternatives. Other alternatives can also be provided where steps are added, one or more steps are removed, or one or more steps are provided in a different sequence without departing from the scope of the claims herein.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A non-volatile memory device, comprising:
   a semiconductor substrate including a surface region;
   a source region within the semiconductor substrate;
   a drain region within the semiconductor substrate;
   a first channel region within the semiconductor substrate, the first channel region extending between a first portion of the source region and a first portion of the drain region;
   a second channel region within the semiconductor substrate, the second channel region extending between a second portion of the source region and a second portion of the drain region;
   a first dielectric layer overlying the first channel region;
   a second dielectric layer overlying the second channel region;
   a floating gate structure overlying the first dielectric layer over the first channel region, the floating gate structure not extending over the second channel region;
   a third dielectric layer over the floating gate structure; and
   a control gate layer overlying the second dielectric layer and the third dielectric layer;
   whereby the second channel region is configured to provide electric carriers to the first channel region during a programming operation of the non-volatile memory device.

2. The device of claim 1, further comprising:
   a third channel region within the semiconductor substrate, the third channel region extending between a third portion of the source region and a third portion of the drain region; and
   a fourth dielectric layer over the third channel region, the fourth dielectric layer being under the control gate layer;
   wherein the third channel region provides electric carriers to the first channel region during a programming operation of the non-volatile memory device.

3. The device of claim 2, wherein the first dielectric layer is disposed between the second dielectric layer and the fourth dielectric layer.

4. The device of claim 2, wherein the control gate completely covers the first, second, and third channel regions.

5. The device of claim 2, wherein the source region and the drain region are separated by a region characterized by a length and a width, the width including a first width of the first channel region, a second width of the second channel region, and a third width of the third channel region.

6. The device of claim 5, wherein the length defines a length of the floating gate structure.

7. The device of claim 1, wherein a length of the first channel region is about 70 nanometers and greater.

8. The device of claim 1, wherein the floating gate structure comprises an in-situ doped silicon layer.

9. The device of claim 1, wherein the third dielectric layer comprises an oxide-nitride-oxide layer.

10. The device of claim 1, wherein the third dielectric layer covers side surfaces of the floating gate structure.

11. The device of claim 1, wherein the floating gate structure has a thickness ranging from 100 nm to 500 nm.

12. The device of claim 1, wherein each of the source and drain regions comprises n-type impurities at a dose ranging from about $1\times10^{15}/\text{cm}^2$ to about $5\times10^{15}/\text{cm}^2$.

13. A non-volatile memory device, comprising:
   a semiconductor substrate including a surface region;
   a source region within the semiconductor substrate;
   a drain region within the semiconductor substrate;
   a first channel region within the semiconductor substrate, the first channel region extending between a first portion of the source region and a first portion of the drain region;
   a second channel region within the semiconductor substrate, the second channel region extending between a second portion of the source region and a second portion of the drain region;
   a first dielectric layer overlying the first channel region;
   a second dielectric layer overlying the second channel region;
   a floating gate structure overlying the first dielectric layer over the first channel region, the floating gate structure not extending over the second channel region;
   a third dielectric layer over the floating gate structure;
   a control gate layer overlying the second dielectric layer and the third dielectric layer;
   a third channel region within the semiconductor substrate, the third channel region extending between a third portion of the source region and a third portion of the drain region; and
   a fourth dielectric layer over the third channel region, the fourth dielectric layer being under the control gate layer;
   whereby the second channel region is configured to provide electric carriers to the first channel region during a programming operation of the non-volatile memory device, wherein the third channel region provides electric carriers to the first channel region during a programming operation of the non-volatile memory device, and wherein each of the second and fourth dielectric layers comprises an oxide-nitride-oxide layer.

14. A non-volatile memory device comprising:

a semiconductor substrate including a surface region;

a source region within the semiconductor substrate;

a drain region within the semiconductor substrate;

a first channel region within the semiconductor substrate, the first channel region extending between a first portion of the source region and a first portion of the drain region;

a second channel region within the semiconductor substrate, the second channel region extending between a second portion of the source region and a second portion of the drain region;

a first dielectric layer overlying the first channel region;

a second dielectric layer overlying the second channel region;

a floating gate structure overlying the first dielectric layer over the first channel region, the floating gate structure not extending over the second channel region;

a third dielectric layer over the floating gate structure;

a control gate layer overlying the second dielectric layer and the third dielectric layer;

a third channel region within the semiconductor substrate, the third channel region extending between a third portion of the source region and a third portion of the drain region; and a fourth dielectric layer over the third channel region, the fourth dielectric layer being under the control gate layer; and spacers on side surfaces of the first dielectric layer, the floating gate structure, the third dielectric layer, and the control gate layer, the spacers being disposed along the width including the first width of the first channel region, the second width of the second channel region, and the third width of the third channel region, wherein the second channel region is configured to provide electric carriers to the first channel region during a programming operation of the non-volatile memory device, and wherein the third channel region provides electric carriers to the first channel region during the programming operation of the non-volatile memory device.

* * * * *